United States Patent
Mora et al.

(10) Patent No.: US 6,777,802 B1
(45) Date of Patent: Aug. 17, 2004

(54) INTEGRATED CIRCUIT PACKAGE SUBSTRATE WITH MULTIPLE VOLTAGE SUPPLIES

(75) Inventors: Leonard L. Mora, San Jose, CA (US); Abi Awujoola, Union City, CA (US); Ed Fulcher, Palo Alto, CA (US)

(73) Assignee: LSI Logic Corporation, Milpitas, CA (US)

( * ) Notice: Subject to any disclaimer, the term of this patent is extended or adjusted under 35 U.S.C. 154(b) by 83 days.

(21) Appl. No.: 10/164,494

(22) Filed: Jun. 6, 2002

(51) Int. Cl.[7] .................. H01L 23/48; H01L 23/52; H01L 23/053; H01L 23/12; H01L 29/40

(52) U.S. Cl. .................. 257/691; 257/690; 257/700; 257/738; 257/758; 257/774; 257/780; 257/781; 257/786

(58) Field of Search .................. 257/691, 690, 257/692, 693, 697, 698, 700, 737, 738, 758, 773, 774, 780, 781

(56) References Cited

U.S. PATENT DOCUMENTS 5,274,270 A * 12/1993 Tuckerman .................. 257/758
5,801,440 A * 9/1998 Chu et al. .................. 257/691
6,445,066 B1 * 9/2002 Miller .................. 257/691

* cited by examiner

Primary Examiner—Nathan J. Flynn
Assistant Examiner—Victor A. Mandala, Jr.
(74) Attorney, Agent, or Firm—Conley Rose, P.C.

(57) ABSTRACT

A semiconductor substrate having multiple signal voltage power supplies is provided. The substrate may include a signal voltage power ring separated into segmented voltage supply connections laterally spaced across the upper surface of the substrate. In addition, the substrate may include a voltage supply plane formed within the substrate. The voltage supply plane may be separated into segmented planes. Vias may electrically connect the segmented voltage supply connections to the segmented planes. In an embodiment, at least 2 of the segmented planes may have different voltage supplies. For example, each of the segmented voltage supply connections are configurable to supply power to a portion of input/output drivers of an integrated circuit. Voltage supplies of the segmented planes may be determined based on voltage requirements of the portions of the input/output drivers.

20 Claims, 7 Drawing Sheets

INTEGRATED CIRCUIT PACKAGE SUBSTRATE WITH MULTIPLE VOLTAGE SUPPLIES

RELATED APPLICATIONS

This application is related to the following co-pending U.S. patent application, filed on even date herewith: "Integrated Circuit Package Substrate with High Density Routing Mechanism" by Mora et al.

BACKGROUND OF THE INVENTION

1. Field of Invention

This invention relates to integrated circuit packaging, and more particularly, to a packaging layout that provides high density routing of signal lines as differential pairs with approximately equal trace lengths and as a pair of signal conductor planes embedded between power and ground planes and multiple voltage supplies within the package substrate.

2. Description of Related Art

The following descriptions and examples are not admitted to be prior art by virtue of their inclusion within this section.

During manufacture of an integrated circuit (e.g., a microprocessor), signal lines formed upon the silicon substrate, which are to be connected to external devices, may be formed such that these lines terminate at flat metal contact regions called input/output (I/O) pads. Following manufacture, the integrated circuit may typically be secured within a protective semiconductor device package. Each I/O pad of the integrated circuit may be connected to one or more terminals of the device package. The terminals of a device package are typically arranged about the periphery of the package. Fine metal wires may be used to connect the I/O pads of the chip to terminals of the device package. Some types of device packages have terminals called "pins" for insertion into holes in a printed circuit board (PCB). Other types of device packages have terminals called "leads" for attachment to flat metal contact regions on an exposed surface of a PCB.

The I/O pads of the integrated circuit may be coupled to terminals of the device package configured to supply power from one voltage supply power plane to input/output drivers of the I/O. Integrated circuits are increasingly being designed to include input/output drivers requiring different voltage supplies on the same die. The location and number of input/output drivers requiring different voltage supplies may also vary in location and number depending upon the integrated circuit design. Therefore, each different integrated circuit design may require a custom designed package substrate. For example, each substrate would have to be laid out and designed thereby requiring engineering resources, increasing costs due to the separate tooling costs associated with each different substrate, and increasing the complexity of controlling the inventory of multiple different substrates. Therefore, current substrate design methodologies can not accommodate the different voltage supplies required by input/output drivers at acceptable costs.

As integrated circuit fabrication technology improves, manufacturers are able to integrate more and more circuits onto single silicon substrates. As the number of circuits on a single chip increases, however, the number of signal lines which need to be connected to external devices also increases. The corresponding numbers of required I/O pads and device package terminals increase as well as the complexities and costs of the device packages. Constraints of high volume PCB assembly operations place lower limits on the physical dimensions of and distances between device package terminals. As a result, the areas of peripheral-terminal device packages having hundreds of terminals are largely proportional to the number of terminals. These larger packages with fine-pitch leads are subject to mechanical damage during handling or testing. For example, mishandling may result in a loss of lead coplanarity, thereby adversely affecting PCB assembly yields. In addition, the lengths of signal lines from chip I/O pads to device package terminals increase with the number of terminals, and the high-frequency electrical performance of larger peripheral-terminal device packages suffer as a result.

Unlike more conventional peripheral-terminal device packages, grid array semiconductor device packages have terminals arranged in a two-dimensional array across the underside surface of the device package. As a result, the physical dimensions of grid array device packages having hundreds of terminals are much smaller than their peripheral-terminal counterparts. Such smaller packages are highly desirable in portable device applications such as laptop and palmtop computers and hand-held communications devices such as cellular telephones. In addition, the lengths of signal traces from the chip I/O pads to device package terminals are shorter, thus the high-frequency electrical performances of grid array device packages are typically better than those of corresponding peripheral-terminal device packages. Grid array device packages also allow the continued use of existing PCB assembly equipment developed for peripheral-terminal devices.

An increasingly popular type of grid array device package is the ball grid array (BGA) device package. A BGA device package includes a chip mounted upon a larger substrate substantially made of, for example, fiberglass-epoxy printed circuit board material or a ceramic material (e.g., aluminum oxide, alumina ($Al_2O_3$), or aluminum nitride (AlN)). Many BGA device packages have die areas dimensioned to receive integrated circuit chips and use established wire bonding techniques to electrically connect the I/O pads of the chips to corresponding flat metal "signal bonding pads" adjacent to the die areas. During wire bonding, the I/O pads of the chip may be electrically connected to corresponding signal bonding pads by fine metal wires (i.e., bonding wires). The substrate may include one or more layers of signal lines (i.e., signal traces or interconnects) which may connect signal bonding pads to corresponding members of a set of ball pads arranged in a two-dimensional array across the underside surface of the device package. Solder balls may be attached to the ball pads, and function as device package terminals. The resulting solder balls on the underside of the BGA device package allow the device to be surface mounted to an ordinary PCB. During PCB assembly, the solder balls are placed in physical contact with corresponding ball pads of the PCB. The solder balls are then heated long enough for the solder to flow. When the solder cools, the ball pads on the underside of the package are electrically and mechanically coupled to ball pads of the PCB.

A BGA device package on a plastic carrier is known as a plastic ball grid array (PBGA) device. A PBGA, may include, for example, four conductive layers separated by three dielectric layers. The top conductive layer includes signal traces, the second conductive layer is a ground plane, the third conductive layer includes signal traces, and the bottom conductive layer is a power plane. A die is bonded to the top of this package. The die may be wirebonded to the substrate, which may be molded to cover and protect the die and the gold wire.

As dies become more dense and complex, the signal trace density of packages also increases. There are at least two problems associated with increases in signal trace density. First, the area on the signal trace layer may be insufficient for the required signal traces. Second, increasing signal trace density on a package may lead to increased cross talk between the signal traces and overall noise of the package. Therefore, current wire bonding layer methodologies may not accommodate the number of signal traces without violating current assembly or substrate design rules.

SUMMARY OF THE INVENTION

The problems outlined above may be in large part addressed by a package that includes a substrate having multiple signal voltage power supplies and/or high density signal routing. In an embodiment, a semiconductor substrate may include signal bonding pads formed upon an upper surface of the substrate. The substrate may also include balls formed upon a lower surface of the substrate. The substrate may further include a signal voltage power ring separated into segmented voltage supply connections laterally spaced across the upper surface of the substrate. In addition, the substrate may include a voltage supply plane formed within the substrate. The voltage supply plane may be separated into segmented planes. In an embodiment, the voltage supply plane may include at least four segmented planes. In another embodiment, the voltage supply plane may include 16 segmented planes. In a further embodiment, a number of the segmented voltage supply connections may equal a number of the segmented planes.

Vias may electrically connect the segmented voltage supply connections to the segmented planes. The substrate may also include signal traces extending from the signal bonding pads to the balls. The signal traces may extend from the signal bonding pads such that the signal traces can be coupled to input/outputs of an integrated circuit. The vias may provide a reference for a substantial portion of a length of the signal traces. In addition, the signal traces may be referenced to the segmented planes. The segmented planes may have supply voltages corresponding to supply voltages required by input/output drivers of the input/outputs to which the signal traces are connected.

In an embodiment, at least two of the segmented planes may have different voltage supplies. For example, each of the segmented voltage supply connections is configurable to supply power to a portion of input/output drivers of an integrated circuit. Voltage supplies of the segmented planes may be determined based on voltage requirements of the portions of the input/output drivers. In addition, input/output drivers of an integrated circuit requiring different voltage supplies may be electrically connected to different segmented voltage supply connections.

In another embodiment, the substrate may include a core voltage power ring separated into quadrants spaced across the upper surface. Two of the quadrants may be connected to a first voltage plane, and the other two quadrants may be connected to a second voltage plane. The first voltage plane may have a supply voltage different than the second voltage plane.

An additional embodiment relates to a semiconductor substrate that includes a signal voltage power ring formed on an upper surface of the substrate and spaced from an area adapted to receive an integrated circuit. The signal voltage power ring may be separated into segmented voltage supply connections laterally spaced across the upper surface. The substrate may also include a voltage supply plane formed within the substrate. The voltage supply plane may be separated into segmented planes. In addition, vias may electrically connect the segmented voltage supply connections to the segmented planes. In an embodiment, the substrate may include a ground ring formed on the upper surface and spaced closer to the area than the signal voltage power ring. In addition, the substrate may include a core voltage power ring formed on the upper surface and spaced closer to the area than the signal voltage power ring. In an alternative embodiment, the positions of the signal voltage power ring and the ground ring may be switched with the core voltage power ring spaced between these rings.

In an embodiment, the substrate may further include a first row of signal bonding pads spaced across the upper surface along a first line and spaced farther from the area than the signal voltage power ring. The substrate may also include a second row of signal bonding pads spaced across the upper surface along a second line that may or may not be parallel to the first line and spaced father from the area than the signal voltage power ring. The first row of signal bonding pads may be spaced farther from the area than the second row of signal bonding pads. In an additional embodiment, the substrate may include signal traces electrically connected to the first row and signal traces electrically connected to the second row of signal bonding pads. The signal traces electrically connected to the first row of signal bonding pads may be routed on a first layer of the substrate, and the signal traces electrically connected to the second row of signal bonding pads may be routed on a second layer of the substrate.

In an embodiment, the signal traces may be routed as differential pairs with approximately equal trace lengths. In an additional embodiment, the signal traces electrically connected to the first row of signal bonding pads may be dielectrically spaced between a first voltage plane and a first ground plane. In one such embodiment, the signal traces electrically connected to the second row of signal bonding pads may be dielectrically spaced between a second voltage plane and a second ground plane. In an alternative embodiment, the signal traces electrically connected to the first row of signal bonding pads may be formed across the upper surface. In a further embodiment, vias electrically coupled to the second row of signal bonding pads may be arranged in adjacent pairs with gaps between the adjacent pairs.

An additional embodiment relates to an integrated circuit package that includes an integrated circuit placed upon an upper surface of a semiconductor substrate. The package may also include a signal voltage power ring separated into segmented voltage supply connections laterally spaced across the upper surface. The integrated circuit may include first and second input/output,drivers. The first input/output driver may be electrically connected to a first segmented voltage supply connection, and the second input/output driver may be electrically connected to a second segmented voltage supply connection. The input/output drivers may be electrically connected to the segmented voltage supply connections by wires. In addition, the package may include a voltage supply plane separated into segmented planes formed within the substrate. In an embodiment, a first segmented plane may be adapted to supply a first voltage to the first segmented voltage supply connection. In addition, a second segmented plane may be adapted to supply a second voltage to the second segmented voltage supply connection. The first voltage may be different than the second voltage.

Another embodiment relates to a semiconductor substrate that includes signal bonding pads formed upon an upper surface of the substrate arranged in a first row and a second row. The first row may or may not be parallel to the second row. In an embodiment, an area on the upper surface may be adapted to receive an integrated circuit. In such an embodiment, the first row of signal bonding pads may be spaced farther from the area than the second row of signal bonding pads. The substrate may also include first signal traces electrically connected to the first row of signal bonding pads. The first signal traces may be routed on a first layer of the substrate. In addition, the substrate may include second signal traces electrically connected to the second row of signal bonding pads. The second signal traces may be routed on a second layer of the substrate. The first layer may be formed across the upper surface, and the second layer may be dielectrically spaced between a voltage plane and a ground plane. The substrate may further include balls formed on a lower surface of the substrate.

In an embodiment, the first and second signal traces may be routed as differential pairs with approximately equal trace lengths. In another embodiment, all of the first and second signal traces may be routed as differential pairs. In a further embodiment, the second signal traces may include vias arranged in adjacent pairs with gaps between the adjacent pairs. The gaps may provide continuity for a ground plane to which the second signal traces are referenced.

In an additional embodiment, the substrate may include a signal voltage power ring separated into segmented voltage supply connections laterally spaced across the upper surface. Such a substrate may also include a voltage supply plane formed within the substrate. The voltage supply plane may be separated into segmented planes. Vias may electrically connect the segmented voltage supply connections to the segmented planes. In a further embodiment, the substrate may include a core voltage power ring separated into quadrants spaced across the upper surface. Two of the quadrants may be connected to a first voltage plane, and the other two quadrants may be connected to a second voltage plane.

An additional embodiment relates to a semiconductor substrate that includes signal bonding pads formed upon an upper surface of the substrate arranged in a first row and a second row. The first row may or may not be parallel to the second row. The substrate may also include first signal traces electrically connected to the first row of signal bonding pads. The first signal traces may be routed on a first layer of the substrate dielectrically spaced between a first voltage plane and a first ground plane. In an embodiment, the first layer may be spaced symmetrically between the first voltage plane and the first ground plane. In one embodiment, all of the signal traces on the first layer may be routed as differential pairs. In an additional embodiment, the first signal traces may include blind vias extending from the upper surface to the first layer and blind vias extending from the first layer to a lower surface of the substrate.

In addition, the substrate may include second signal traces electrically connected to the second row of signal bonding pads. The second signal traces may be routed on a second layer of the substrate dielectrically spaced between a second voltage plane and a second ground plane. In an embodiment, the second layer may be spaced symmetrically between the second voltage plane and the second ground plane. In another embodiment, all of the signal traces on the second layer may be routed as differential pairs. In a further embodiment, the second signal traces may include through hole vias extending from the upper surface to the second layer and blind vias extending from the second layer to a lower surface of the substrate.

A further embodiment relates to an integrated circuit package that includes an integrated circuit placed upon an area of an upper surface of a semiconductor substrate. The package may also include signal bonding pads formed upon an upper surface of the substrate arranged in a first row and a second row. The first row may or may not be parallel to the second row. In addition, the first row of signal bonding pads may be spaced farther from the area than the second row of signal bonding pads. The signal bonding pads may be electrically connected to bonding pads of the integrated circuit by wires. The package may further include signal traces electrically connected to the first row and the second row of signal bonding pads. The signal traces may be routed in differential pairs on different layers of the substrate.

In an embodiment, the package may include a signal voltage power ring separated into segmented voltage supply connections laterally spaced across the upper surface and a voltage supply plane formed within the substrate. The voltage supply plane may be separated into segmented planes. In addition, vias may electrically connect the segmented voltage supply connections to the segmented planes.

BRIEF DESCRIPTION OF THE DRAWINGS

Other objects and advantages of the invention will become apparent upon reading the following detailed description and upon reference to the accompanying drawings in which.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Figure 1:
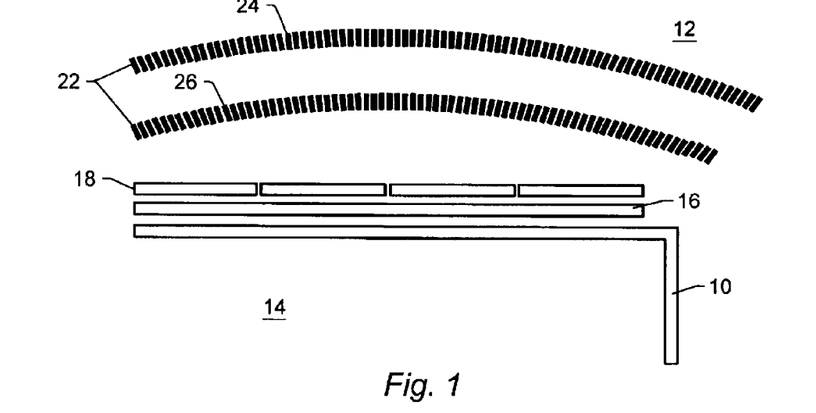
FIG. 1 is a schematic top view of an embodiment of a portion of a semiconductor substrate having multiple signal voltage power supplies.

Turning now to the drawings, FIG. 1 is a top schematic view of an embodiment of a portion of a semiconductor substrate having multiple signal voltage power supplies. The substrate includes ground ring 10 formed on upper surface 12 of the substrate. Ground ring 10 is spaced from area 14 on upper surface 12 adapted to receive an integrated circuit (not shown). The substrate also includes core power supply ring 16 formed on upper surface 12 and spaced farther from area 14 than ground ring 10. In addition, the substrate also includes signal voltage power ring 18 formed on upper surface 12 and spaced farther from area 14 than core power supply ring 16. Alternatively, the lateral positions of ground ring 10 and signal voltage power ring 18 may be switched.

The semiconductor substrate includes signal bonding pads 22 formed upon upper surface 12 of the substrate spaced farther from area 14 than the signal voltage power ring. Signal bonding pads 22 are arranged in first row 24 spaced across the upper surface along a first line and second row 26 spaced across the upper surface along a second line. The second line may or may not be parallel to the first line. First row 24 of signal bonding pads is spaced farther from area 14 than second row 26 of signal bonding pads. Therefore, the substrate includes five rows of bonding: ground ring 10, core power supply ring 16, signal voltage power ring 18, and two rows 24 and 26 of signal bonding pads 22. The substrate may also include a soldermask (not shown) formed on the upper surface of the substrate. The soldermask may be formed on an area of the upper surface of the substrate not occupied by the five rows of bonding.

Figure 2:
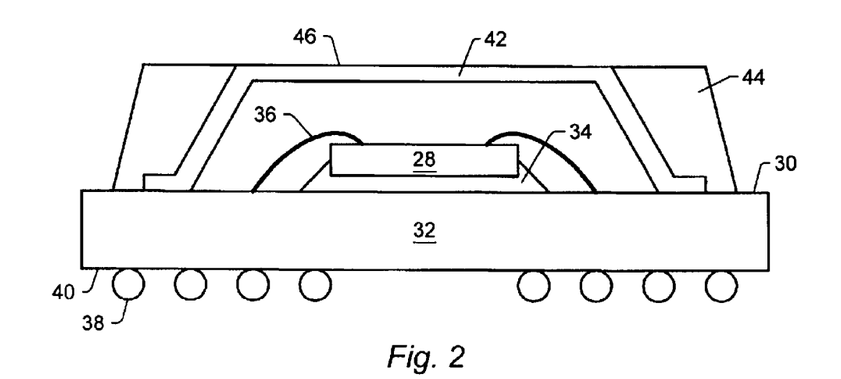
FIG. 2 is a cross-sectional side view of an embodiment of an integrated circuit package that includes a semiconductor substrate coupled to an integrated circuit.

Each row of bonding may be coupled to an integrated circuit by wire bonding. FIG. 2 is a cross-sectional side view of an embodiment of an integrated circuit package that includes a semiconductor substrate coupled to an integrated circuit. The semiconductor substrate may be configured according to any of the embodiments described herein. Integrated circuit 28 may be coupled to upper surface 30 of substrate 32 with adhesive 34. Adhesive 34 may include solder, organic adhesives (such as epoxies or polymides), or glass adhesives (such as silver-filled specialty glass materials). Adhesive 34, however, may also include any other adhesive known in the art. Integrated circuit 28 may be a logic device such as an application specific integrated circuit (ASIC) or a field programmable grid array (FPGA). Integrated circuit 28, however, may also be any other semiconductor device known in the art. Integrated circuit 28 may be placed upon an area of upper surface 30, which may be located substantially in the center of upper surface 30. Integrated circuit 28, however, may be positioned in other locations on upper surface 30.

Integrated circuit 28 includes bonding pads (not shown), which may be located substantially at the edges of integrated circuit 28. The bonding pads may be formed on a surface of the integrated circuit, for example, by depositing a conductive material such as a Pb-rich alloy or copper on the surface of the substrate. The bonding pads may also be formed of a material such as gold, palladium, or any other appropriate conductive material known in the art. The five rows of bonding of the substrate may also be formed in this manner.

The bonding pads on the integrated circuit may be coupled to one or more of the rows of bonding on substrate 32 by wire bonding. Wire bonding involves attaching relatively small wires 36 from a device side of integrated circuit 28 to one of the five rows of bonding on upper surface 30 of substrate 32. Wire bonding may be performed using either thermosonic or ultrasonic welding with a bonding method such as ball bonding and wedge bonding, which are known in the art. Wire bonding may also include any other welding process known in the art such as thermocompression welding.

Balls 38 are formed upon lower surface 40 of substrate 32. Balls 38 may be formed upon ball pads (not shown) formed across an area of lower surface 40 of the substrate. The ball pads may be formed as described herein. An array of the balls, or a ball grid array, may be formed across lower surface 40. Therefore, the integrated circuit and the substrate may be referred to as a ball grid array (BGA) integrated circuit package, and may be further configured as described above. The substrate may also be a plastic ball grid array (PBGA) integrated circuit package or an enhanced plastic ball grid array (EPBGA) integrated circuit package. The balls may be formed of a material such as, but not limited to, a Pb-rich alloy or solder. The balls may be pre-formed and attached to surface 40 of substrate 32.

Heat spreader 42 may be coupled to upper surface 30 of substrate 32. For example, the heat spreader may be coupled to the upper surface with mold 44 such that the heat spreader forms a cavity over integrated circuit 28. The mold may include, for example, an epoxy. The heat spreader may transfer heat from the integrated circuit by convection. The heat spreader may be formed of a conductive material such as copper. Top surface 46 of heat spreader 42 may be exposed, and a heat sink may optionally be coupled directly to the top surface of the heat spreader. The heat spreader may also reduce exposure of the integrated circuit to the environment. Alternatively, the heat spreader may be eliminated from the substrate.

Figure 3:
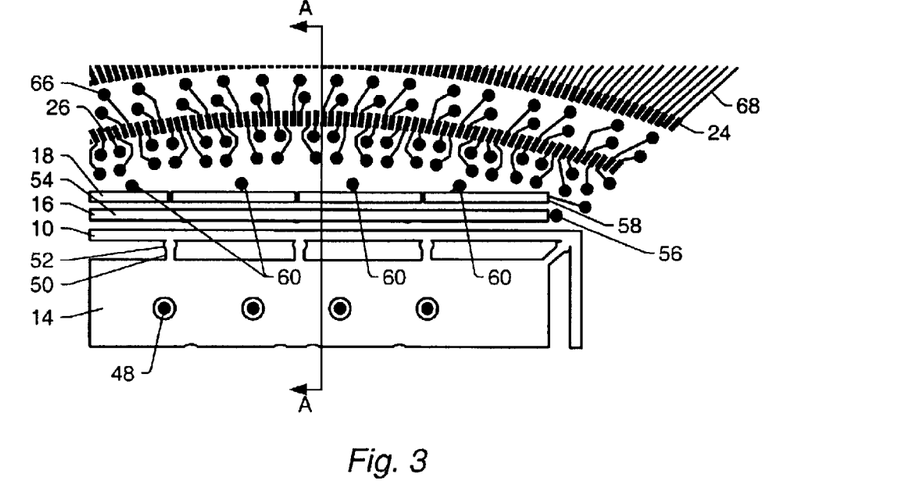
FIG. 3 is a schematic top view of an embodiment of a portion of the semiconductor substrate of FIG. 1.

FIG. 3 is a top schematic view of an embodiment of a portion of the semiconductor substrate of FIG. 1 shown in more detail. Area 14 may include a layer of a conductive material such as copper formed on the upper surface of the substrate. Vias 48 are formed through the layer of conductive material and other layers of the substrate. Vias 48 may electrically or thermally connect one layer of the substrate to terminals on the integrated circuit. For example, vias 48 can be used to conduct heat from an integrated circuit (not shown), to provide core power to the integrated circuit, and/or to provide ground for the integrated circuit. Area 14 may be electrically connected to ground ring 10 by interconnects 50. Interconnects 50 may be conductive lines formed on the upper surface of the substrate between area 14 and ground ring 10. Therefore, ground ring 10 may provide ground to the integrated circuit through the layer of conductive material formed on area 14. The integrated circuit may be attached to area 14 by an adhesive as described above.

Ground ring 10 may be a layer of a conductive material such as copper patterned on the upper surface of the substrate by deposition, metallization, or any other process known in the art. The ground ring may be electrically connected to vias 52, as shown in FIG. 3. Vias 52 may electrically connect ground ring 10 to a ground plane, or a reference plane, (not shown) formed within the substrate. Bonding ground pads on the integrated circuit may be electrically connected to ground ring 10 by wire bonding.

Figure 3A:
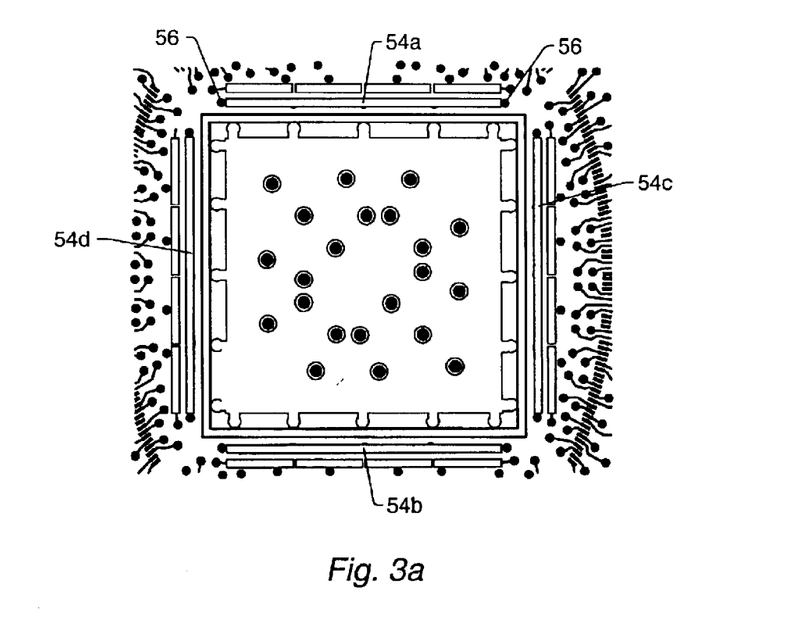
FIG. 3a is a schematic top view of the portion of the semiconductor substrate of FIG. 3 illustrating an entire core voltage power ring.

Core voltage power ring 16 may also be a layer of a conductive material such as copper patterned on the upper surface of the substrate by deposition, metallization, or any other process known in the art. Core voltage power ring 16 is separated into quadrants 54 spaced across the upper surface of the substrate. A portion of one quadrant is shown in FIGS. 1 and 3. FIG. 3a is a top schematic view of the portion of the semiconductor substrate of FIG. 3 showing the entire core voltage power ring. Vias 56 may electrically connect the quadrants to a voltage supply plane. Quadrants 54a and 54b may be connected to a first voltage plane (not shown), and quadrants 54c and 54d may be connected to a second voltage plane (not shown). The first voltage plane may be formed within the substrate between two dielectric layers and may be formed on layer 3 of a multi-layer substrate, and the second voltage plane may be formed on a bottom layer of the substrate. The first voltage plane may have a supply voltage different than the second voltage plane. Therefore, the core voltage power ring provides multiple core power supplies to the integrated circuit separate from the signal voltage power supply. In addition, the core voltage power ring may provide more than two different core power supplies to the integrated circuit. For example, three or more of the quadrants may be electrically connected to different voltage planes having different supply voltages. Furthermore, the quadrants of the core voltage power ring may also be separated into segmented core voltage power connections and electrically connected to a segmented voltage plane as described herein.

Figure 4:
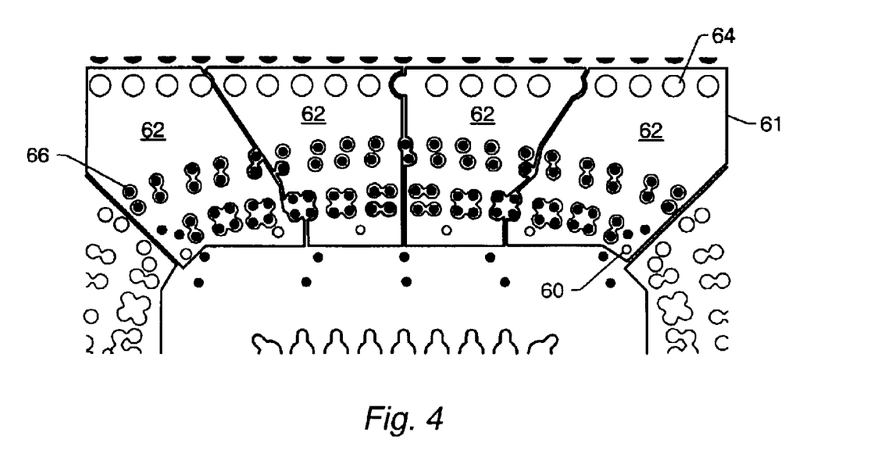
FIG. 4 is a cross-sectional schematic top view of an embodiment of a portion of the semiconductor substrate shown in FIG. 3 illustrating layout of a segmented voltage supply plane.

Signal voltage power ring 18 may also be a layer of a conductive material such as copper patterned on the upper surface of the substrate by deposition, metallization, or any other process known in the art. Signal voltage power ring 18 is separated into segmented voltage supply connections 58 laterally spaced across upper surface 12 of the substrate. As shown in FIG. 3, one fourth of the signal voltage power ring is separated into four connections. Therefore, the signal voltage power ring shown in FIG. 3 may include about 16 connections. At least one via 60 electrically connects segmented voltage supply connections 58 to voltage supply plane 61 formed within the substrate, as shown in FIG. 4. FIG. 4 is a top cross-sectional schematic view of an embodiment of a portion of the semiconductor substrate shown in FIG. 3 illustrating a layout of a segmented voltage supply plane. Voltage supply plane 61 may be located on a bottom layer of the substrate. As shown in FIG. 4, voltage supply plane 61 is separated into segmented planes 62. For example, voltage supply plane 61 may be a layer of a conductive material such as copper patterned on a dielectric layer of the substrate by deposition, metallization, or any other process known in the art. The segmented planes may be separated by a dielectric material formed between the patterned portions of conductive material by a process such as deposition such that the segmented planes may be electrically isolated from each other. At least one via 60 electrically connects each segmented voltage supply connection to a segmented voltage plane. Each segmented plane is connected to one or more voltage supply pins 64 to complete the circuit.

In an embodiment, the voltage supply plane includes at least four segmented planes. FIG. 4 illustrates one quadrant of the entire voltage supply plane that includes four segmented planes. Each quadrant may include four segmented planes. Each segmented plane is connected to a separate voltage supply. Therefore, the entire voltage supply plane includes 16 segmented voltage planes, which can be connected to 16 separate voltage supplies. In this manner, the voltage supply for each segmented plane may be independent from the voltage supply for each of the other segmented planes. The segmented voltage planes provide power to input/output drivers of an integrated circuit coupled to the substrate.

Currently, integrated circuits are designed with different types of input/output drivers to meet various electrical applications. Since different input/output drivers can require different supply voltages, it is advantageous to have a substrate that has isolated supply voltages. The location of the supply voltage may vary for each integrated circuit design. Therefore, ideally, a first input/output driver may be electrically connected to a first segmented voltage supply connection, and a second input/output driver may be electrically connected to a second segmented voltage supply connection. The input/output drivers may be electrically connected to the segmented voltage supply connections by wires as described above. In an embodiment, a first segmented plane may be adapted to supply a first voltage to the first segmented voltage supply connection. In addition, a second segmented plane may be adapted to supply a second voltage to the second segmented voltage supply connection. The first voltage may be independent and different than the second voltage. In this manner, input/output drivers of an integrated circuit requiring different voltage supplies may be electrically connected to different segmented voltage supply connections. Therefore, an ideal layout would have a segmented plane for each input/output driver. Due to substrate constraints, however, the number of segmented planes will typically be less than the number of input/output drivers on the integrated circuit. The optimal number of segmented planes may vary depending upon design constraints. For example, each of the segmented voltage supply connections are configured to supply power to a portion of input/output drivers of an integrated circuit. Therefore, voltage supplies of the segmented planes may be determined based on voltage requirements of the portions of the input/output drivers.

In an embodiment, at least two of the segmented planes have different voltage supplies. For example, although 16 different voltage supplies may be required by any integrated circuit die design, a relatively small number of different voltage supplies (i.e., 2, 3, 4, 5, or 6) may be required in varying locations on the die. Therefore, a substrate that includes such a voltage supply plane allows for at least two voltage supplies to be arranged in different locations in numerous combinations. The flexibility of moving different voltage supplies to different locations on the same substrate design will allow the use of one substrate design for different integrated circuit designs with multiple signal voltage supplies. Furthermore, it is to be understood that the voltage supply plane may include any number of segmented planes. For example, the number of segmented planes may be increased to about 20 or more. In a further embodiment, a number of segmented voltage supply connections 58 may equal a number of segmented planes 62. In such an embodiment, each segmented voltage supply connection may be electrically connected to a different segmented plane. Such a segmented voltage plane may be included in substrates having any number of lead counts and having any lateral dimensions.

As shown in FIG. 3, second row 26 of signal bonding pads are bonding fingers electrically connected to vias 66, which extend into the substrate from the upper surface of the substrate in a direction substantially perpendicular to the upper surface. FIG. 4 shows a layout of locations of vias 66 above segmented voltage plane 61. As shown in FIG. 3, first row 24 of signal bonding pads are electrically connected to signal traces 68, which extend across the upper surface of the substrate. Vias 66 and signal traces 68 are a portion of signal traces. The signal traces extend from the signal bonding pads such that the signal traces can be coupled to input/outputs of an integrated circuit. The signal traces also extend from the signal bonding pads to balls on lower surface of substrate.

Figure 5:
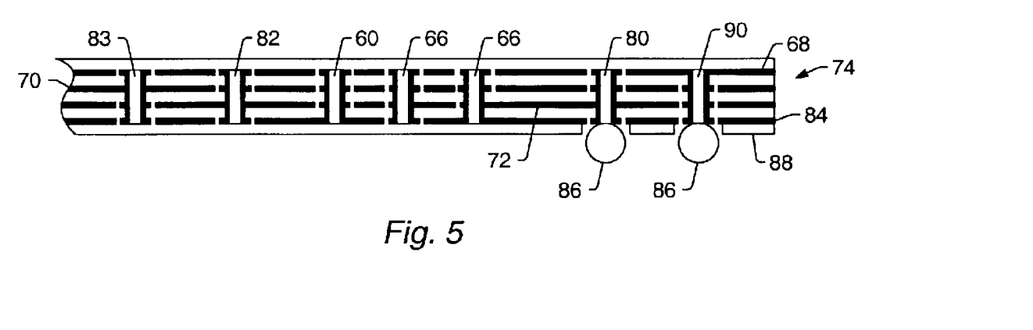
FIG. 5 is a partial cross-sectional side view along plane A of an embodiment of the substrate illustrated in FIG. 3.

FIG. 5 is a partial cross-sectional side view along plane A of an embodiment of the substrate illustrated in FIG. 3. As shown in FIG. 5, the signal traces are routed on different layers of the substrate. For example, vias 66 extend from the bonding fingers on a first layer of the substrate through ground plane 70 on a second layer of the substrate to conductive traces 72 formed on a third layer of substrate 74. The ground plane may be spaced below a first conductive layer of the substrate by a dielectric layer and above the conductive traces by a dielectric layer. Vias 80 may couple conductive traces 72 to balls 86 formed on lower surface 88 of substrate 74 by extending through voltage supply plane 84 to balls 86. Voltage supply plane 84 may be spaced above a lower surface of the substrate and below conductive traces 72 by dielectric layers. Vias 66 and vias 80 may be through hole vias. The voltage supply plane may be segmented as described above. As shown in FIG. 5, conductive trace 72 is dielectrically spaced between ground plane 70 and voltage supply plane 84 by dielectric layers, respectively. Such routing of signal traces is commonly referred to as a stripline configuration. As further shown in FIG. 5, via 60 electrically connects a segmented voltage supply connection to segmented voltage plane 84. Via 82 electrically connects the core voltage power ring to a core voltage plane on the third layer of substrate 74, and via 83 electrical connects the ground ring to ground plane 70 on the second layer of the substrate.

Figure 6:
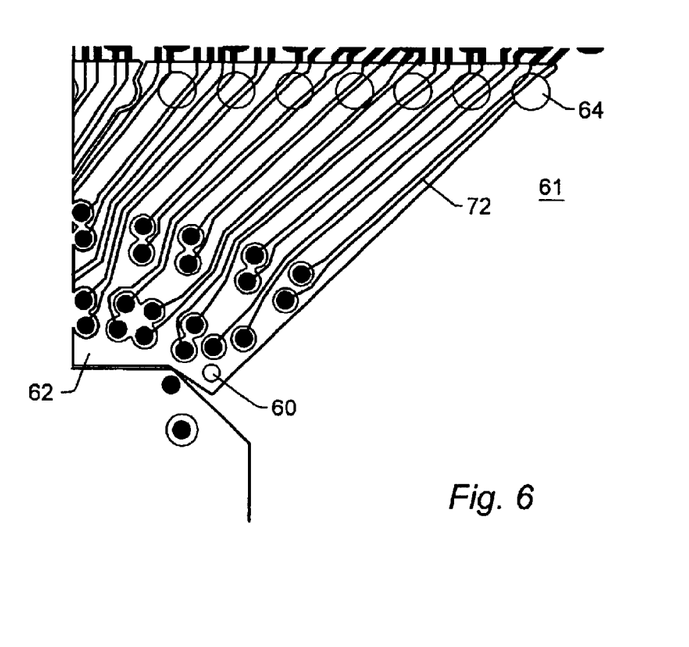
FIG. 6 is a cross-sectional schematic top view of an embodiment of a portion of the semiconductor substrate shown in FIG. 5 illustrating layout of the conductive traces on the third layer and a segmented voltage plane on the fourth layer.

FIG. 6 is a top cross-sectional schematic view of an embodiment of a portion of the semiconductor substrate shown in FIG. 5 illustrating the layout of the conductive traces on the third layer and a segmented voltage plane on the fourth layer. The conductive traces on the third layer are referenced to the voltage supply plane 61 on the fourth, or bottom, layer. Via 60 electrically connects a segmented voltage supply connection to segmented voltage plane 62. The vias are located behind conductive traces 72 formed on the third layer. Such a location for vias 60 provides a reference for a substantial portion of the trace length to the segmented voltage planes on the fourth layer. Furthermore, the segmented planes to which the signal traces are referenced have voltage supplies corresponding to voltage supplies of the input/output drivers coupled to the signal traces. Therefore, groups of input/outputs with different voltages will have their signal traces referenced to corresponding relatively low inductance voltage planes segments. FIG. 6 also illustrate the locations of voltage supply pins 64.

Signal traces 68, which are electrically connected to the first row of bonding pads, are routed on the first layer of the substrate to vias 90 as shown in FIG. 5. Vias 90 may be through hole vias. Vias 90 extend from the first layer of the substrate in a direction substantially perpendicular to the upper surface through ground plane 70 on the second layer, conductive traces 72 on the third layer, and voltage plane 84 on the fourth layer to balls 86. Signal traces 68 electrically connected to the first row of bonding pads are formed on a surface of a dielectric layer with air above the signal traces and ground plane 70 on the opposite of the dielectric layer. Such routing of signal traces is commonly referred to as a micro stripline configuration.

Vias 66, signal traces 68, ground plane 70, conductive trace 72, via 80, voltage supply plane 84, and vias 90 may be formed of a conductive material such as copper, silver, gold, tungsten, molybdenum, platinum, palladium, nickel, chromium, invar, kovar, silver-palladium, gold-palladium, aluminum, gold-tin (20%), or lead-tin (5%). The conductive material, however, may also include any other conductive material known in the art. In addition, vias 66, signal traces 68, ground plane 70, conductive trace 72, via 80, voltage supply plane 84, and vias 90 may be formed of the same or different materials in any combination. The dielectrics may be formed of a dielectric material such as Bismaleimide/ Triazine (BT) or Preimpregnated Glass Cloth (Prepeg). The dielectric material, however, may also include any other dielectric known in the art. In addition, the dielectrics may be formed of the same or different materials in any combination. The dielectrics may be formed by a lamination process. Therefore, the substrate may be commonly referred to as a wire bond laminate substrate.

Figure 7:
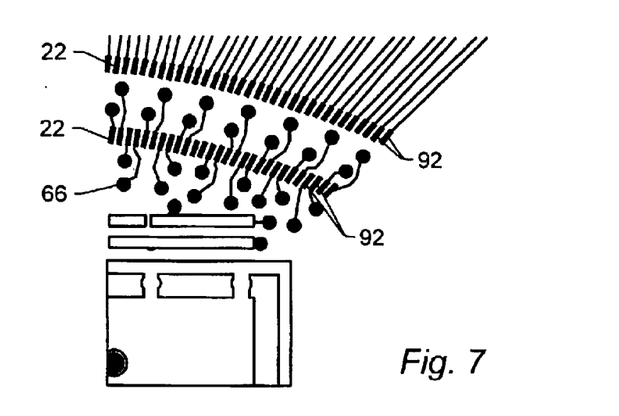
FIGS. 7 and 8 are schematic top views of various embodiments of the portion of the semiconductor substrate of FIG. 3 shown in more detail.
Figure 8:
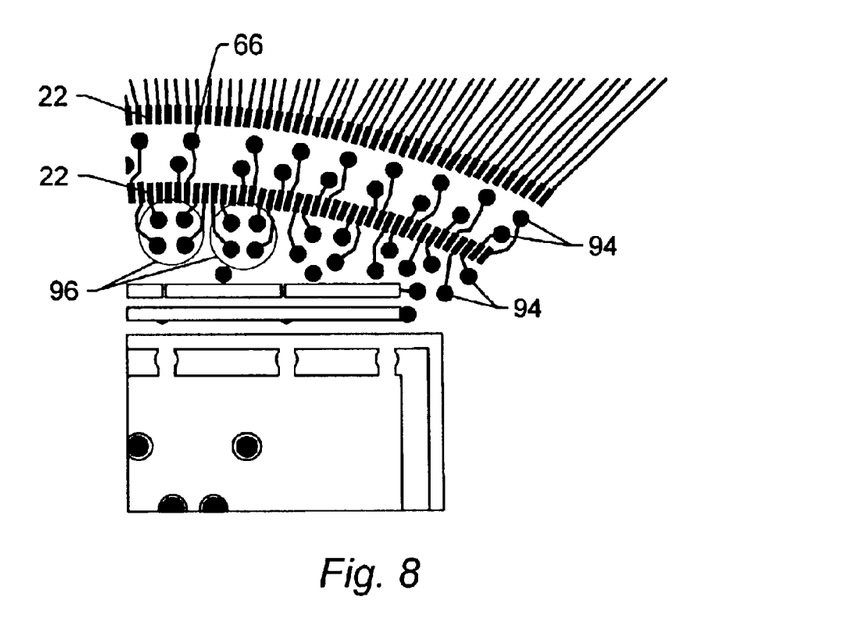

FIGS. 7 and 8 are top schematic views of various embodiments of the portion of the semiconductor substrate of FIG. 3 shown in more detail. As described above, signal bonding pads 22 are arranged on the outer two rows of bonding. Locating the signal bonding pads on the outer rows allows the pads to be moved in as close to the integrated circuit as possible without violating current substrate or assembly design constraints. In addition, laying out the signal bonds pads in separate rows allows the signal traces to be routed on different layers of the substrate. For example, the signal traces may be routed on layers 1 and 3 of a substrate as described above and shown in FIG. 5. Alternatively, the signal traces may be routed on layers 2 and 5 as described herein. Therefore, the number of signal traces may be increased for a given substrate size thereby accommodating increases in input/outputs of an integrated circuit without increasing the substrate size. The arrangement of the signal bonding pads also provides increases in the number of signal traces for a given die size without violating current assembly or substrate design rules.

In addition, the signal traces coupled to signal bonding pads in both rows can be routed as differential pairs 92, as shown in FIG. 7. The signals traces of the differential pairs have approximately equal trace lengths. For example, vias 66, which are described in more detail above, may be routed in adjacent pairs 94, as shown in FIG. 8. Laying out vias 66 in adjacent pairs allows for conductive traces coupled to the vias such as conductive traces 72 formed on layer 3, as described above, to be routed as differential pairs with closely matched trace lengths. Furthermore, all of the first and second signal traces may be routed as differential pairs. Therefore, arranging the signal bonding pads into two rows as described herein provide 100% differential signal routing. Routing signal traces as differential pairs reduces differential noise coupling and differential signal propagation delay.

Figure 9:
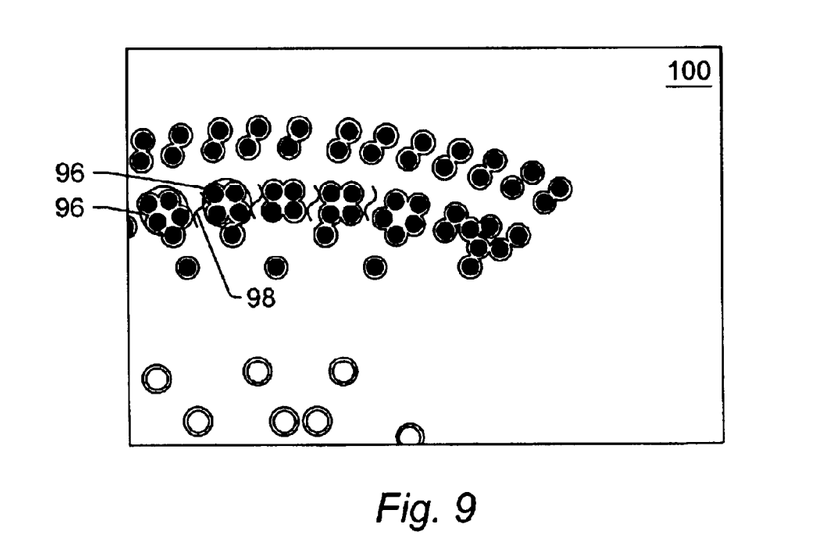
FIG. 9 is a cross-sectional schematic top view of an embodiment of a portion of the semiconductor substrate shown in FIG. 8 illustrating layout of via pairs and gaps across ground plane 100.

As further shown in FIG. 8, vias 66 that are located between the second row of bonding and the signal voltage supply ring may be arranged such that two via pairs 96 can be routed adjacent to each other in groups. Routing two via pairs adjacent to each other creates gaps 98 between two via pairs 96, as shown in FIG. 9. FIG. 9 is a top cross-sectional schematic view of an embodiment of a portion of the semiconductor substrate shown in FIG. 8 illustrating the layout of via pairs 96 and gaps 98 across ground plane 100.

The ground plane may be configured as ground plane 70 described above. The gaps may provide continuity for ground plane 100 to which the second signal traces are referenced. Therefore, creating gaps between two via pairs improves the reference for the vias to the ground plane than if the vias were routed without the gaps.

Figure 10:
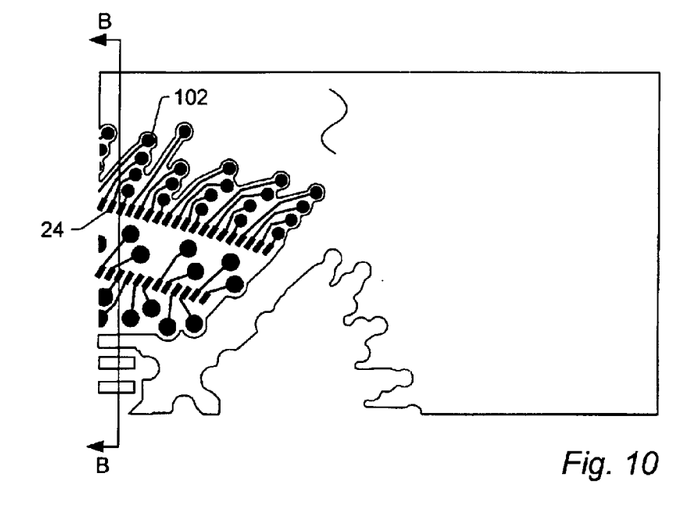
FIG. 10 is a schematic top view of another embodiment of a portion of the semiconductor substrate of FIG. 1.
Figure 11:
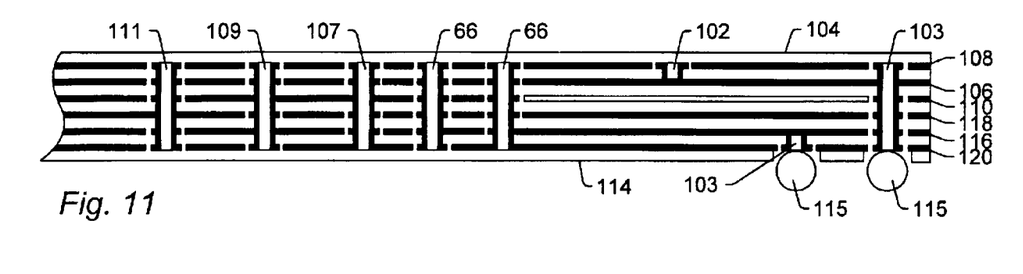
FIG. 11 is a cross-sectional side view along plane B of a portion of the semiconductor substrate of FIG. 10.

FIG. 10 is a top schematic view of another embodiment of a portion of the semiconductor substrate of FIG. 1 shown in more detail. This embodiment may be configured as described above except that first row 24 of signal bonding pads are bonding fingers electrically connected to vias 102 instead of signal traces 68. Vias 102 extend into the substrate from the upper surface of the substrate in a direction substantially perpendicular to the upper surface. In such an embodiment, the substrate may include a 6 layer wire bond substrate. Each conductive layer may be dielectrically separated as described above. FIG. 11 is a cross-sectional side view along plane B of a portion of the semiconductor substrate of FIG. 10. The substrate may include layers 106 and 116 on which conductive traces are routed. Each layer of conductive traces may be disposed between power plane and ground plane 108, 110 and 118, 120, respectively. Therefore, the signal traces on both layers may be arranged in a stripline configuration thereby improving the electrical performance of the substrate. The signal traces in such an embodiment may also be routed as differential pairs on both layers as described above.

The substrate may also include vias 107 that electrically connect segmented voltage supply connections on a first layer of the substrate to segmented voltage supply planes on the third and sixth layers of the substrate. In addition, the substrate may include vias 109 that electrically connect a core voltage power ring on the first layer to core voltage supply planes on the third and fifth layers of the substrate. Furthermore, the substrate may include vias 111 that electrically connect a ground ring on the first layer of the substrate to a ground plane of the fourth layer of the substrate.

Figure 12:
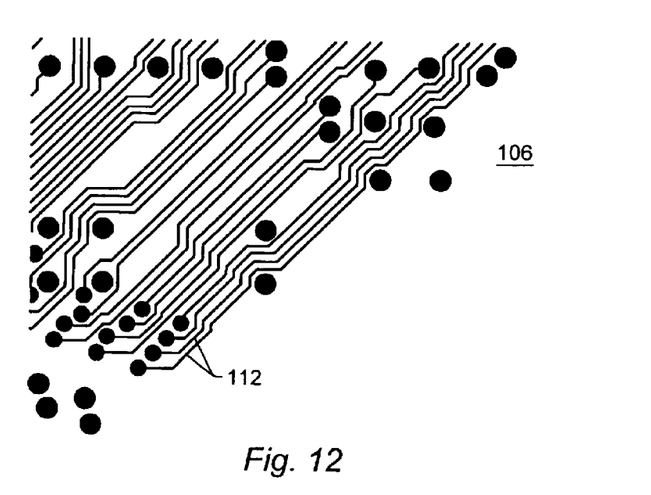
FIGS. 12 and 13 are cross-sectional top views of a portion of the semiconductor substrate of FIG. 11 illustrating various embodiments of a layout of conductive traces on different layers of the substrate.

Vias 102, shown in FIG. 10, extend from a first layer of the substrate to layer 106 of the substrate. Layer 106 is dielectrically spaced between power or ground planes 108 and 110 in a stripline configuration. Layer 106 includes conductive traces dielectrically separated from one another. FIG. 12 is a cross-sectional top view of a portion of the semiconductor substrate of FIG. 11 illustrating one embodiment of a layout of conductive traces on layer 106. As shown in FIG. 12 the conductive traces are routed as adjacent pairs 112 with controlled spacing between the traces. To achieve 100% differential pair routing on layer 106, all conductive traces on layer 106 are routed as adjacent pairs 112 with controlled spacing between traces. The controlled spacing and a width of the traces may be selected to achieve selected single-ended and differential impedances. For example, an appropriate spacing may be less than about 100 mm, and an appropriate width may be about 50 mm. The controlled spacing between differential pairs and the trace width may vary, however, depending upon, for example, a dielectric constant of the dielectric material formed between the differential pairs. The conductive traces on layer 106 may also be symmetrically spaced between power and ground planes 108 and 110. For example, a dielectric layer formed between layer 106 and layer 108 may have a thickness approximately equal to a thickness of a dielectric layer 106 and layer 110. Furthermore, all of the signal traces routed on layer 106 may be used for single-ended (non-differential) input/output because single-ended impedance is also controlled.

As shown in FIG. 11, vias 102 are blind vias extending from the first layer of the substrate to layer 106 of the substrate. "Blind vias" may also be commonly referred to as "photo vias." Blind vias are formed by optical imaging or laser processing capable of producing small holes at high rates in both thin-film and multi-layer substrates. Blind vias are often used for vias having a relatively small diameter for which mechanical drilling is difficult. In addition, the blind vias may be formed from an upper surface of the substrate to a buried conductor. Therefore, blind vias may be shorter than through hole vias formed by mechanical drilling. In this manner, the blind vias will not be formed on layers of conductive traces formed below layer 106. As such, the layout of vias 102 will not affect the layout of conductive traces formed on other layers. In addition, using blind vias allows vias 103 to be placed over ball pads and balls 115 formed on lower surface 114 of the semiconductor substrate. In this manner, a larger die size may be used.

Figure 13:
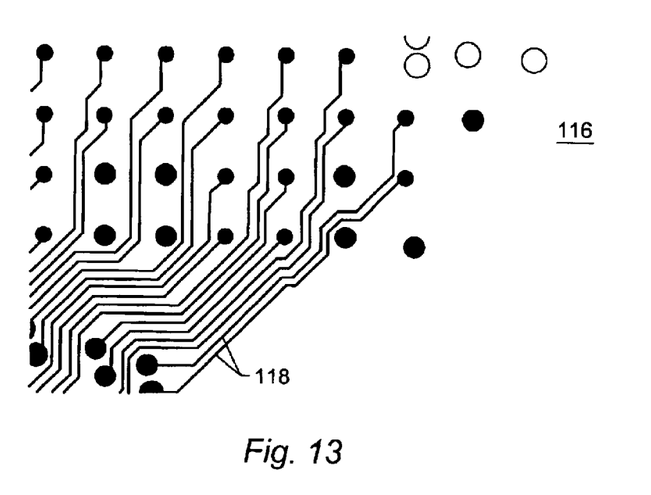

Vias 66, shown in FIG. 11, extend from the first layer of the substrate, in a direction substantially perpendicular to upper surface 104 of the substrate, to layer 116 of the substrate, as shown in FIG. 11. Layer 116 may include conductive traces dielectrically separated from one another. Layer 116 is also dielectrically spaced from power or ground planes 118 and 120. FIG. 13 is a cross-sectional top view of a portion of the semiconductor substrate of FIG. 11 illustrating one embodiment of a layout of conductive traces on layer 116. As shown in FIG. 13, the conductive traces are routed as adjacent pairs 118 with controlled spacing between the traces. To achieve 100% differential pair routing on layer 116, all conductive traces on layer 116 are routed as adjacent pairs with controlled spacing between traces. The controlled spacing and a width of the traces may be selected to achieve selected single-ended and differential impedances. For example, an appropriate spacing may be less than about 100 mm, and an appropriate width may be about 50 mm. The controlled spacing between differential pairs and the trace width may vary, however, as described above. The conductive traces on layer 116 may also be symmetrically spaced between power and ground planes 118 and 120. For example, a dielectric layer formed between layer 116 and slayer 118 may have a thickness approximately equal to a thickness of a dielectric layer between layer 116 and layer 120. Furthermore, all of the signal traces routed on layer 116 may be used for single-ended (non-differential) input/output because single-ended impedance is also controlled.

Vias 66 are through hole vias, which may be formed by mechanical drilling. Through hole vias may be used because vias 66 are spaced closer to the integrated circuit than vias 102. Therefore, the through hole vias will not affect the layout of conductive traces on layer 106. Blind vias 103, however, are used to connect conductive traces on layers 106 and 116 to balls 115 formed on lower surface 114. If through holes vias were used in place of these blind vias, the through hole vias would appear on layer 106 thereby causing the conductive traces on layer 106 to be routed around the through hole vias. Such routing would increase the conductive trace lengths and reduce the routing area thereby increasing the difficulty of maintaining controlled spacing between the conductive traces to meet the differential impedance.

It will be appreciated by those skilled in the art having the benefit of this disclosure that this invention is believed to present an integrated circuit package substrate that provides multiple voltage supplies, high density routing, and/or signal traces routed in a stripline configuration. Further modifications and alternative embodiments of various aspects of the invention will be apparent to those skilled in the art in view of this description. Details described herein, such as materials or dimensions are exemplary of a particular embodiment. It is intended that the following claims be interpreted to embrace all such modifications and changes and, accordingly, the specification and drawings are to be regarded in an illustrative rather than a restrictive sense.

What is claimed is:

1. A semiconductor substrate, comprising:
    signal bonding pads formed upon an upper surface of the substrate;
    a signal voltage power ring separated into segmented voltage supply connections laterally spaced across the upper surface;
    a voltage supply plane formed within the substrate, wherein the voltage supply plane is separated into segmented planes, and wherein vias electrically connect the segmented voltage supply connections to the segmented planes; and
    balls formed upon a lower surface of the substrate.

2. The substrate of claim 1, wherein at least 2 of the segmented planes have different voltage supplies.

3. The substrate of claim 1, wherein each of the segmented voltage supply connections are configurable to supply power to a portion of input/output drivers of an integrated circuit, and wherein voltage supplies of the segmented planes are determined based on voltage requirements of the portions of the input/output drivers.

4. The substrate of claim 1, wherein input/output drivers of an integrated circuit requiring different voltage supplies are electrically connected to different segmented voltage supply connections.

5. The substrate of claim 1, wherein the voltage supply plane comprises at least 4 of the segmented planes.

6. The substrate of claim 1, wherein the voltage supply plane comprises 16 of the segmented planes.

7. The substrate of claim 1, wherein a number of the segmented voltage supply connections equals a number of the segmented planes.

8. The substrate of claim 1, further comprising signal traces extending from the bonding pads to the balls, wherein the vias provide a reference for a substantial portion of a length of the signal traces.

9. The substrate of claim 1, further comprising signal traces extending from the bonding pads such that the signal traces can be coupled to input/outputs of an integrated circuit, wherein the signal traces are referenced to the segmented planes having supply voltages corresponding to supply voltages required by input/output drivers of the input/outputs.

10. The substrate of claim 1, further comprising a core voltage power ring separated into quadrants spaced across the upper surface, wherein two of the quadrants are connected to a first voltage plane, and wherein the other two quadrants are connected to a second voltage plane.

11. A semiconductor substrate, comprising:
    a signal voltage power ring formed on an upper surface of the substrate and spaced from an area adapted to receive an integrated circuit, wherein the signal voltage power ring is separated into segmented voltage supply connections laterally spaced across the upper surface;
    a voltage supply plane formed within the substrate, wherein the voltage supply plane is separated into segmented planes, and wherein vias electrically connect the segmented voltage supply connections to the segmented planes;
    a first row of signal bonding pads spaced across the upper surface along a first line and spaced farther from the area than the signal voltage power ring; and
    a second row of signal bonding pads spaced across the upper surface along a second line parallel to the first line and spaced farther from the area than the signal voltage power ring, wherein the first row of signal bonding pads is spaced farther from the area than the second row of signal bonding pads.

12. The substrate of claim 11, further comprising a ground ring formed on the upper surface and spaced closer to the area than the signal voltage power ring.

13. The substrate of claim 11, further comprising a core voltage power ring formed on the upper surface and spaced closer to the area than the signal voltage power ring.

14. The substrate of claim 11, further comprising first signal traces electrically connected to the first row and second signal traces electrically connected to the second row of signal bonding pads, wherein the first signal traces are routed on a first layer of the substrate, and wherein the second signal traces are routed on a second layer of the substrate.

15. The substrate of claim 11, further comprising first signal traces electrically connected to the first row and second signal traces electrically connected to the second row of signal bonding pads, wherein the first and second signal traces are routed as differential pairs with approximately equal trace lengths.

16. The substrate of claim 11, further comprising first signal traces electrically connected to the first row of signal bonding pads and dielectrically spaced between a first voltage plane and a first ground plane in a stripline configuration, and second signal traces electrically connected to the second row of signal bonding pads and dielectrically spaced between a second voltage plane and a second ground plane in a stripline configuration.

17. The substrate of claim 11, further comprising first signal traces electrically connected to the first row of signal bonding pads and formed across the upper surface and second signal traces electrically connected to the second row of signal bonding pads and dielectrically spaced between a voltage plane and a ground plane.

18. The substrate of claim 11, further comprising vias electrically coupled to the second row of signal bonding pads, wherein the vias are arranged in adjacent pairs with gaps between the adjacent pairs.

19. An integrated circuit package, comprising:
    an integrated circuit placed upon an upper surface of a semiconductor substrate, wherein the integrated circuit comprises first and second input/output drivers;
    a signal voltage power ring separated into segmented voltage supply connections laterally spaced across the upper surface, wherein the first input/output driver is electrically connected to a first of the segmented voltage supply connections, and wherein the second input/output driver is electrically connected to a second of the segmented voltage supply connections; and
    a voltage supply plane separated into segmented planes formed within the substrate, wherein a first of the segmented planes is adapted to supply a first voltage to the first segmented voltage supply connection, wherein a second of the segmented planes is adapted to supply a second voltage to the second segmented voltage supply connection, and wherein the first voltage is different than the second voltage.

20. The package of claim 19, wherein the first and second input/output drivers are electrically connected to the first and second segmented voltage supply connections, respectively, by wires.

* * * * *